US011823330B2

(12) United States Patent
Inoue et al.

(10) Patent No.: US 11,823,330 B2
(45) Date of Patent: Nov. 21, 2023

(54) DETECTION DEVICE, DETECTION METHOD AND DETECTION PROGRAM FOR LINEAR STRUCTURE

(71) Applicant: NIPPON TELEGRAPH AND TELEPHONE CORPORATION, Tokyo (JP)

(72) Inventors: Masaaki Inoue, Musashino (JP); Hitoshi Niigaki, Musashino (JP); Yukihiro Goto, Musashino (JP); Shigehiro Matsuda, Musashino (JP); Toshiya Ohira, Musashino (JP); Ryuji Honda, Musashino (JP); Tomoya Shimizu, Musashino (JP); Hiroyuki Oshida, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 101 days.

(21) Appl. No.: 17/634,595

(22) PCT Filed: Aug. 19, 2019

(86) PCT No.: PCT/JP2019/032324
§ 371 (c)(1),
(2) Date: Feb. 11, 2022

(87) PCT Pub. No.: WO2021/033249
PCT Pub. Date: Feb. 25, 2021

(65) Prior Publication Data
US 2022/0327779 A1    Oct. 13, 2022

(51) Int. Cl.
*G06T 17/20* (2006.01)
*G06F 30/18* (2020.01)
*G01B 11/00* (2006.01)

(52) U.S. Cl.
CPC ............ *G06T 17/20* (2013.01); *G01B 11/002* (2013.01); *G06F 30/18* (2020.01)

(58) Field of Classification Search
CPC ..... G06T 17/20; G06T 19/00; G06T 2210/56; G06F 30/18
See application file for complete search history.

(56) References Cited

U.S. PATENT DOCUMENTS

| 2013/0181983 A1* | 7/2013 | Kitamura | ............... G06T 17/00 345/419 |
| 2015/0029182 A1* | 1/2015 | Sun | ...................... G06V 20/176 345/419 |

(Continued)

FOREIGN PATENT DOCUMENTS

| JP | 2017156179 A | 9/2017 |
| JP | 2019109839 A | 7/2019 |

*Primary Examiner* — Ming Wu
(74) *Attorney, Agent, or Firm* — Harness, Dickey & Pierce, P.L.C.

(57) ABSTRACT

An object of the present disclosure is to provide a technique for creating a three-dimensional model of a line-like structure from a point cloud obtained using three-dimensional laser measuring equipment and detecting a three-dimensional model of a cable. A detection apparatus according to the disclosure includes a point cloud data input unit 12 that reads point cloud data where a structure that is present in a three-dimensional space is represented by a point cloud that is present in the three-dimensional space, a rule-based three-dimensional model generation unit 15 that combines linearly disposed point clouds into a group and generates a three-dimensional model of a line-like structure using a direction vector configured with point clouds included in the group, a machine learning-based three-dimensional model generation unit 14 that generates a three-dimensional model of a line-like structure based on a database that links point clouds and line-like structures, and a three-dimensional (Continued)

model merging unit that selects one of a plurality of three-dimensional models of line-like structures generated at an identical position in the three-dimensional space as a three-dimensional model of a line-like structure that is present in the three-dimensional space and merges three-dimensional models of the line-like structures that are present in the three-dimensional space.

7 Claims, 13 Drawing Sheets

(56) References Cited

U.S. PATENT DOCUMENTS

2019/0279417 A1* 9/2019 Castaneda .............. G06T 19/006
2019/0311546 A1* 10/2019 Tay ....................... G05D 1/0088

* cited by examiner

[2]

[3]

[8]

DETECTION DEVICE, DETECTION METHOD AND DETECTION PROGRAM FOR LINEAR STRUCTURE

CROSS-REFERENCE TO RELATED APPLICATIONS

This application is a 371 U.S. National Phase of International Application No. PCT/JP2019/032324, filed on Aug. 19, 2019. The entire disclosure of the above application is incorporated herein by reference.

TECHNICAL FIELD

The present disclosure relates to a line-like structure detection apparatus, a detection method, and a detection program.

BACKGROUND ART

Optical and electrical communication services have achieved service provision through connection of physical facilities between customers' homes to a central office. In order to continue stable service provision, facility maintenance and management tasks are required, and maintenance workers have been visiting sites, individually carrying out visual inspections, and determining whether the facilities are in satisfactory states in order to grasp communication facility states of utility poles, cables, and the like.

In recent years, a technique for determining degradation of a utility pole using an inspection vehicle described in PTL 1 has become known as a means for efficiently diagnosing a utility pole facility. According to the technique, an inspection vehicle provided with a three-dimensional laser scanner (three-dimensional laser measuring equipment), a camera, a global positioning system (GPS) receiver, an inertial measurement unit (IMU), and an odometer is used to travel in a city while performing three-dimensional laser scanning and image capturing, perform three-dimensional measurement of columnar structures including utility poles of the entire area, and collect point cloud data including XYZ coordinates and reflection intensity. Three-dimensional models of the columnar structures are created on the basis of the point cloud data, and deflection vectors of the aforementioned utility poles are calculated from the three-dimensional models, thereby determining degradation. Also, in an area where coordinate accuracy of the point cloud data is insufficient, such as an area that vehicles cannot enter due to a road width or an unpaved road, a fixed three-dimensional laser scanner is used to acquire point cloud data of utility poles, and the point cloud data is analyzed and diagnosed.

Targets to be diagnosed by the related art are utility pole facilities. Cables stretched between utility poles have shapes different from those of the utility poles and also have different diameters and lengths, and it is thus difficult to create three-dimensional models thereof using the related art. An object is to establish a means for diagnosing cables in a two-dimensional and efficient manner, similarly to that for utility poles, through three-dimensional modeling of cables.

CITATION LIST

Patent Literature

PTL 1: JP 2017-156179 A, FACILITY STATE DETECTION METHOD AND APPARATUS INSTALLATION METHOD

PTL 2: JP 2019-109839 A, MODEL GENERATION APPARATUS, GENERATION METHOD, AND PROGRAM

SUMMARY OF THE INVENTION

Technical Problem

An object of the present disclosure is to provide a technique for creating a three-dimensional model of a line-like structure from a point cloud obtained using three-dimensional laser measuring equipment and detecting a three-dimensional model of a cable.

Means for Solving the Problem

A detection apparatus according to the disclosure includes a point cloud data input unit that reads point cloud data in which a structure that is present in a three-dimensional space is represented by a point cloud that is present in the three-dimensional space,
  a rule-based three-dimensional model generation unit that acquires point clouds read by the point cloud data input unit, combines linearly disposed point clouds out of the point clouds acquired into a group, and generates a three-dimensional model of a line-like structure using a direction vector configured with point clouds included in the group,
  a machine learning-based three-dimensional model generation unit that acquires the point cloud read by the point cloud data input unit, identifies, based on a database that links point clouds and line-like structures, point clouds that match a line-like structure out of the point clouds acquired, and generates a three-dimensional model of a line-like structure using the point clouds identified, and
  a three-dimensional model merging unit that selects, in a case in which the rule-based three-dimensional model generation unit and the machine learning-based three-dimensional model generation unit generate a plurality of three-dimensional models of line-like structures at an identical position in the three-dimensional space from the point clouds read by the point cloud data input unit, using position information regarding configuration points of a three-dimensional model and configuration points of the point cloud, one of the plurality of three-dimensional models of line-like structures as a three-dimensional model of a line-like structure that is present in the three-dimensional space and merges three-dimensional models of the line-like structures that are present in the three-dimensional space.
  A detection method according to the disclosure includes by a line-like structure detection apparatus, reading point cloud data in which a structure that is present in a three-dimensional space is represented by a point cloud that is present in the three-dimensional space,
  by the line-like structure detection apparatus, acquiring point clouds that are read, combining linearly disposed point clouds out of the point clouds acquired into a group, and generating a three-dimensional model of a line-like structure using a direction vector configured with point clouds included in the group,
  by the line-like structure detection apparatus, acquiring point cloud that are read, identifying, based on a database that links point clouds and line-like structures, point clouds that match a line-like structure out of the point clouds acquired, and generating a three-dimensional model of a line-like structure using the point clouds identified, and by the line-like structure detection apparatus, selecting, in a case in which a plurality of three-dimensional models of line-like structures are generated at an identical position in the three-dimensional space from the point clouds that are read, using position information regarding configuration points of a three-dimensional model and configuration points of the point cloud, one of the plurality of three-dimensional models of line-like structures as a three-dimensional model of a line-like structure that is present in the three-dimensional space and merging three-dimensional models of line-like structures that are present in the three-dimensional space.

A line-like structure detection program according to the disclosure is a program for causing a computer to be implemented as functional units included in the detection apparatus according to the disclosure, and is a program for causing the computer to execute procedures included in the detection method according to the disclosure.

Effects of the Invention

According to the present disclosure, it is possible to provide a technique of creating a three-dimensional model of a line-like structure from a point cloud obtained using three-dimensional laser measuring equipment and detecting a three-dimensional model of a cable.

DESCRIPTION OF EMBODIMENTS

Hereinafter, embodiments of the present disclosure will be described in detail with reference to the drawings. Note that the present disclosure is not limited to the embodiments described below. These embodiments are just illustrative example, and the present disclosure can be implemented in forms in which various modifications and improvements are added on the basis of knowledge of those skilled in the art. Note that components with the same reference signs in the specification and the drawings are assumed to be the same components.

Figure 1:
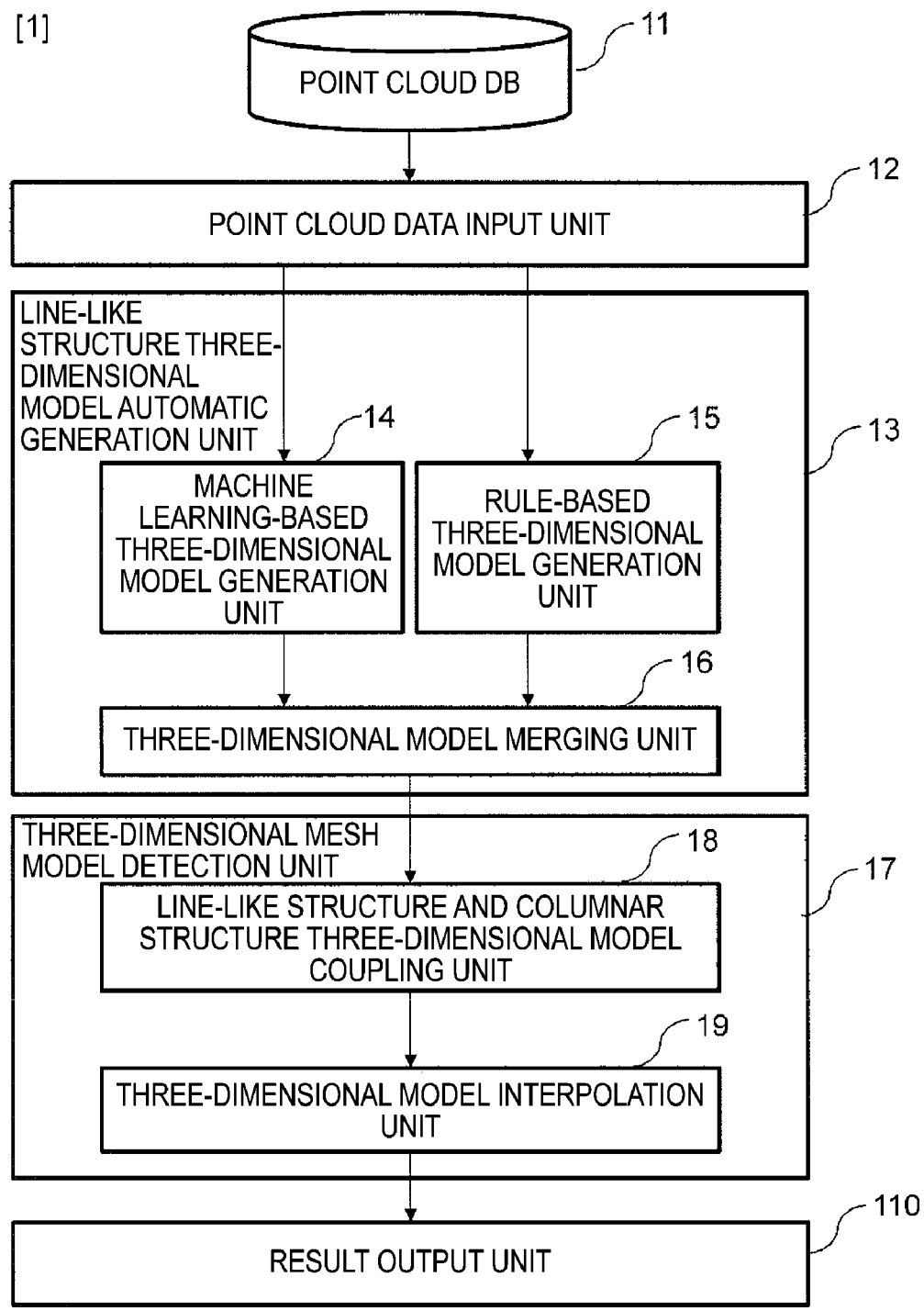
FIG. 1 is a diagram for explaining a method for generating a three-dimensional model of a line-like structure according to an example of the disclosure.

FIG. 1 is a schematic configuration diagram illustrating an example of a detection apparatus according to the disclosure. The detection apparatus according to the present embodiment generates a three-dimensional model of a line-like structure from a point cloud acquired using three-dimensional laser measuring equipment. The detection apparatus according to the present embodiment includes a point cloud database (DB) 11, a point cloud data input unit 12, a line-like structure three-dimensional model generation unit 13, a three-dimensional mesh model detection unit 17, and a result output unit 110.

Figure 2:
FIG. 2 illustrates an example of point cloud data.

The point cloud DB 11 is a database that stores point cloud data representing position coordinates of any object positioned in a three-dimensional space. FIG. 2 illustrates an example of the point cloud data. The point cloud data is a set of position coordinates of each point, in which structures that are present in a three-dimensional space are represented by point clouds that are present in the three-dimensional space. The structures include any objects that are present in the three-dimensional space and include utility poles, which are columnar structures, and electric wires, which are line-like structures. Examples of the position coordinates include three-axis coordinates of XYZ. Any method may be used for measuring point cloud data, and for example, it is possible to use three-dimensional laser measuring equipment fixed to a vehicle, a tripod stand, a carriage, or an unmanned aircraft.

The point cloud data input unit 12 extracts point cloud data to be analyzed from the point cloud DB 11 and passes the point cloud data to a line-like structure three-dimensional model automatic generation unit 13 in a later stage.

The line-like structure three-dimensional model automatic generation unit 13 includes a machine learning-based three-dimensional model generation unit 14, a rule-based three-dimensional model generation unit 15, and a three-dimensional model merging unit 16. The line-like structure three-dimensional model automatic generation unit 13 passes the point cloud data to be analyzed to each of the machine learning-based three-dimensional model generation unit 14 and the rule-based three-dimensional model generation unit 15. The machine learning-based three-dimensional model generation unit 14 generates a three-dimensional model of a line-like structure using machine learning. The rule-based three-dimensional model generation unit 15 generates a three-dimensional model of a line-like structure using a method for generating a three-dimensional model on a rule basis. The two generated three-dimensional models of the line-like structures are passed to the three-dimensional model merging unit 16.

The three-dimensional model merging unit 16 merges the three-dimensional models generated by the machine learning-based three-dimensional model generation unit 14 and the rule-based three-dimensional model generation unit 15. Here, in the fusion, proportions of point clouds included in the three-dimensional models or lengths of the three-dimensional models are compared and selected, and one of them is chosen as a three-dimensional model of the point cloud data. In this manner, the line-like structure three-dimensional model automatic generation unit 13 automatically generates a three-dimensional model of the line-like structure. The selected three-dimensional model of the line-like structure is passed to the three-dimensional mesh model detection unit 17.

The three-dimensional mesh model detection unit 17 includes a line-like structure and columnar structure three-dimensional model coupling unit 18 and a three-dimensional model interpolation unit 19. The line-like structure and columnar structure three-dimensional model coupling unit 18 couples a three-dimensional model of a columnar structure held in advance to the three-dimensional model of the line-like structure acquired from the line-like structure three-dimensional model automatic generation unit 13 to detect a three-dimensional mesh model. The three-dimensional model interpolation unit 19 performs model interpolation on a point cloud lacking section in the three-dimensional model of the line-like structure and outputs the result to the result output unit 110. Here, it is possible to use, for example, approximation calculation or re-measurement for the model interpolation.

The result output unit 110 displays the three-dimensional model configured in a mesh shape on a display unit 103. Here, the three-dimensional mesh model corresponds to an electric wire including a communication line on the assumption that the three-dimensional model of the columnar structure is a utility pole. Hereinafter, each functional unit will be described in detail.

Machine Learning-Based Three-Dimensional Model Generation Unit 14

Figure 3:
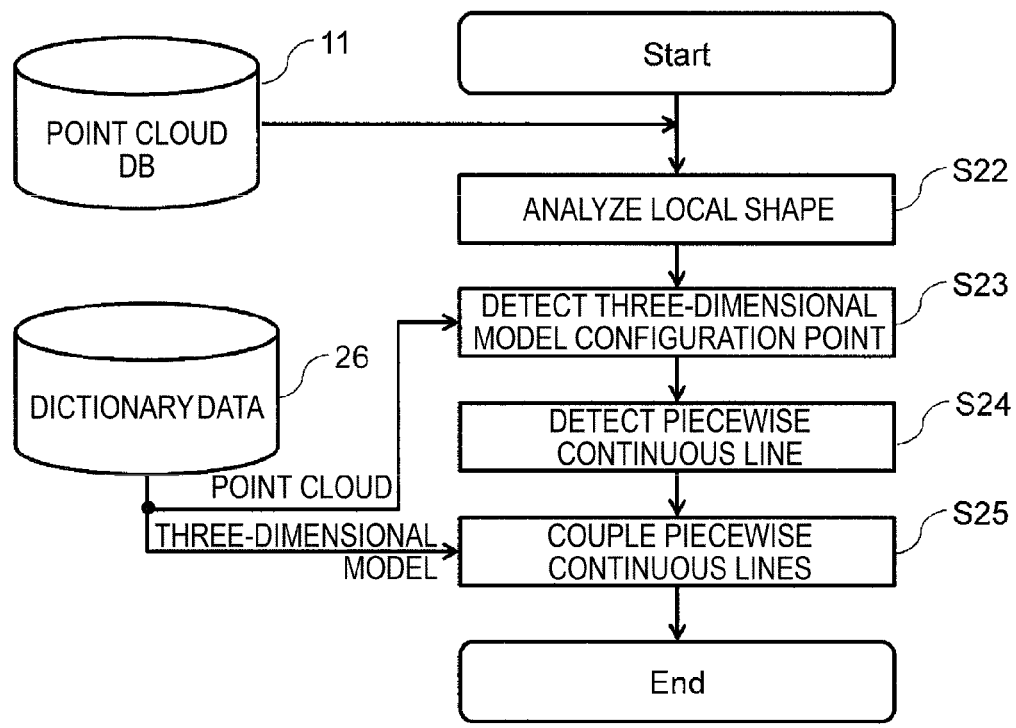
FIG. 3 is a flowchart illustrating an example of three-dimensional model generation processing for a line-like structure based on machine learning.

FIG. 3 is a flowchart illustrating an example of a processing procedure and details of the processing performed by the machine learning-based three-dimensional model generation unit 14. The machine learning-based three-dimensional model generation unit 14 holds dictionary data 26 obtained by learning position coordinates of each point included in point clouds of line-like structures in advance. The dictionary data 26 includes each parameter of a discriminator learned through machine learning. The parameters include position coordinates of each point included in point clouds of line-like structures.

Step S22: The machine learning-based three-dimensional model generation unit 14 performs local shape analysis of grouping three-dimensional model configuration point clouds configuring a three-dimensional model of a line-like structure from three-dimensional point cloud information input from the point cloud DB 11 on the basis of distribution of the point cloud.

Step S23: The machine learning-based three-dimensional model generation unit 14 detects a point cloud configuring the three-dimensional model of the line-like structure using the dictionary data 26 and the grouped point cloud as input data (S23).

Step S24: The machine learning-based three-dimensional model generation unit 14 detects continuous curves that are present in a local region from the three-dimensional model configuration point cloud of the line-like structure. In this manner, a plurality of piecewise continuous lines are detected.

Step S25: The machine learning-based three-dimensional model generation unit 14 determines, using a discriminator learned through machine learning whether to couple two piecewise continuous lines that are a target of determination for coupling, from among the plurality of piecewise continuous lines detected in Step S24 and couples the two piecewise continuous lines that are determined to be coupled. In Step S25, the machine learning-based three-dimensional model generation unit 14 outputs the coupled piecewise continuous line model (a three-dimensional model of the line-like structure) using the dictionary data 26 and the piecewise continuous lines as input data.

In order to generate the dictionary data 26, measured point clouds and correct three-dimensional models created on the basis of the point clouds are prepared, and results (parameters of the discriminator) machine-learned in advance on the basis of the measured point cloud and the correct three-dimensional models are stored in the machine learning-based three-dimensional model generation unit 14. Thus, an increase in number of results learned on the basis of the point clouds and the correct three-dimensional models of the line-like structures accumulated in the dictionary data 26 leads to an increase in certainty of coupling in Step S25, and the shape of the three-dimensional model of the line-like structure more closely approaches the shape of the actual line-like structure. Detailed operations of each function are described in PTL 2.

Rule-Based Three-Dimensional Model Generation Unit 15

Figure 4:
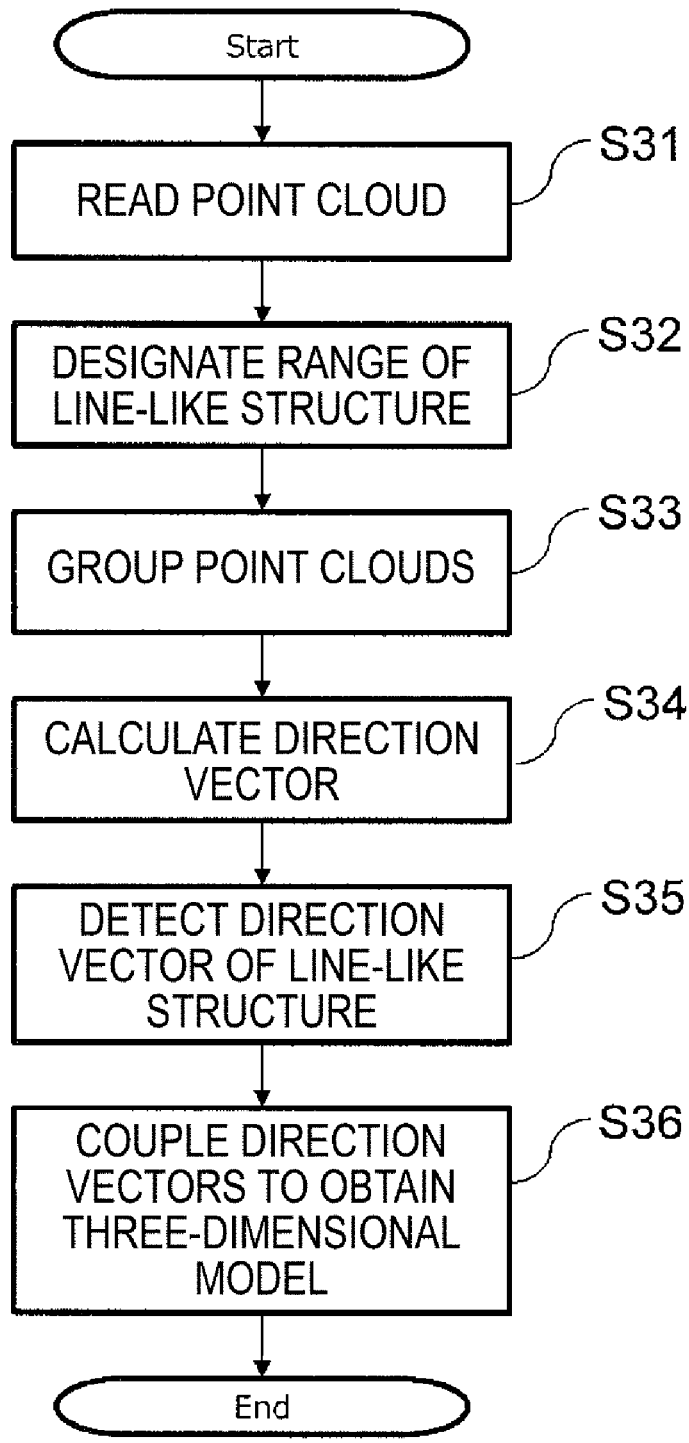
FIG. 4 is a flowchart illustrating an example of three-dimensional model generation processing for a line-like structure on a rule basis.
Figure 5:
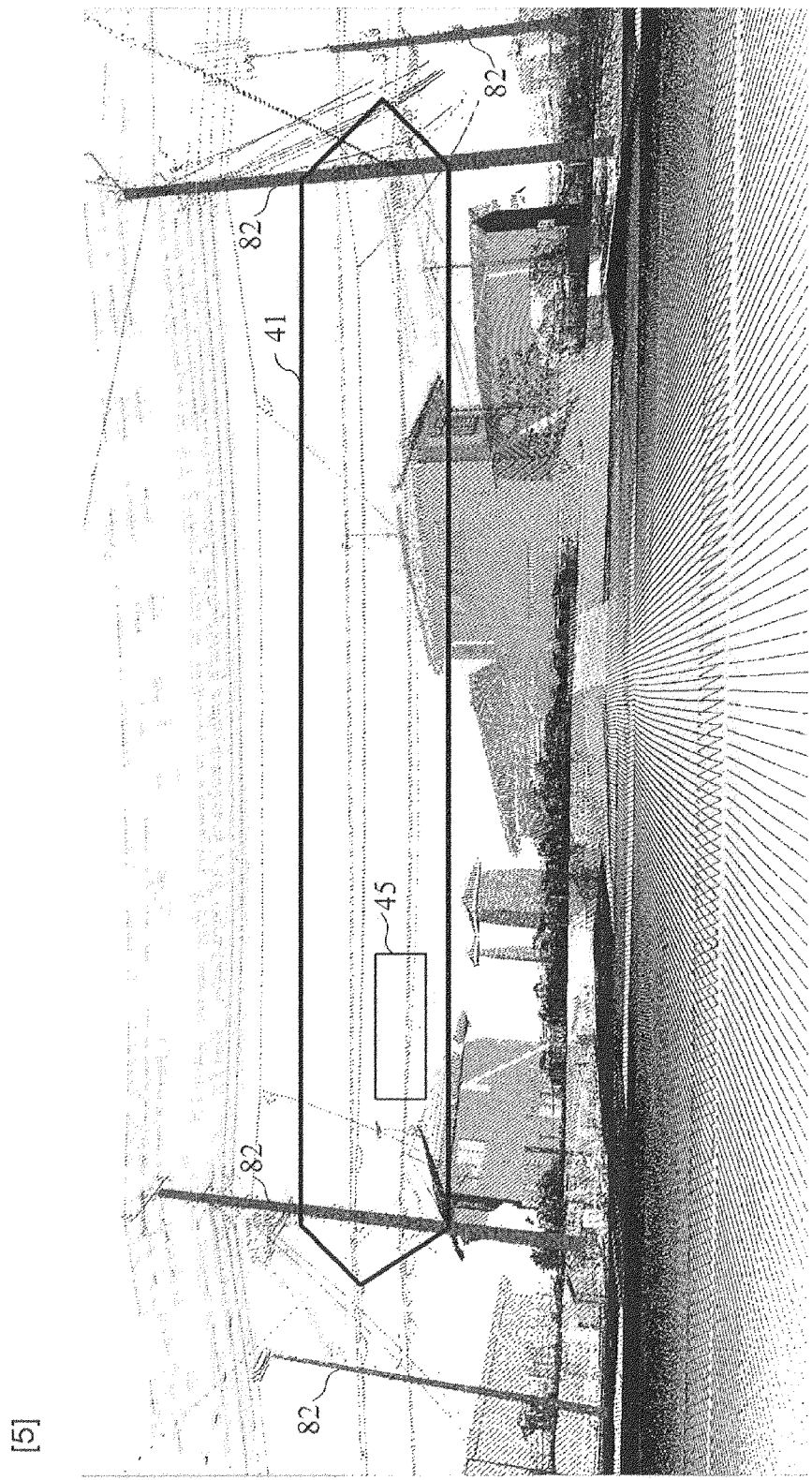
FIG. 5 is a diagram for explaining designation of a range of a three-dimensional space in the three-dimensional model generation processing for a line-like structure on a rule basis.
Figure 6:
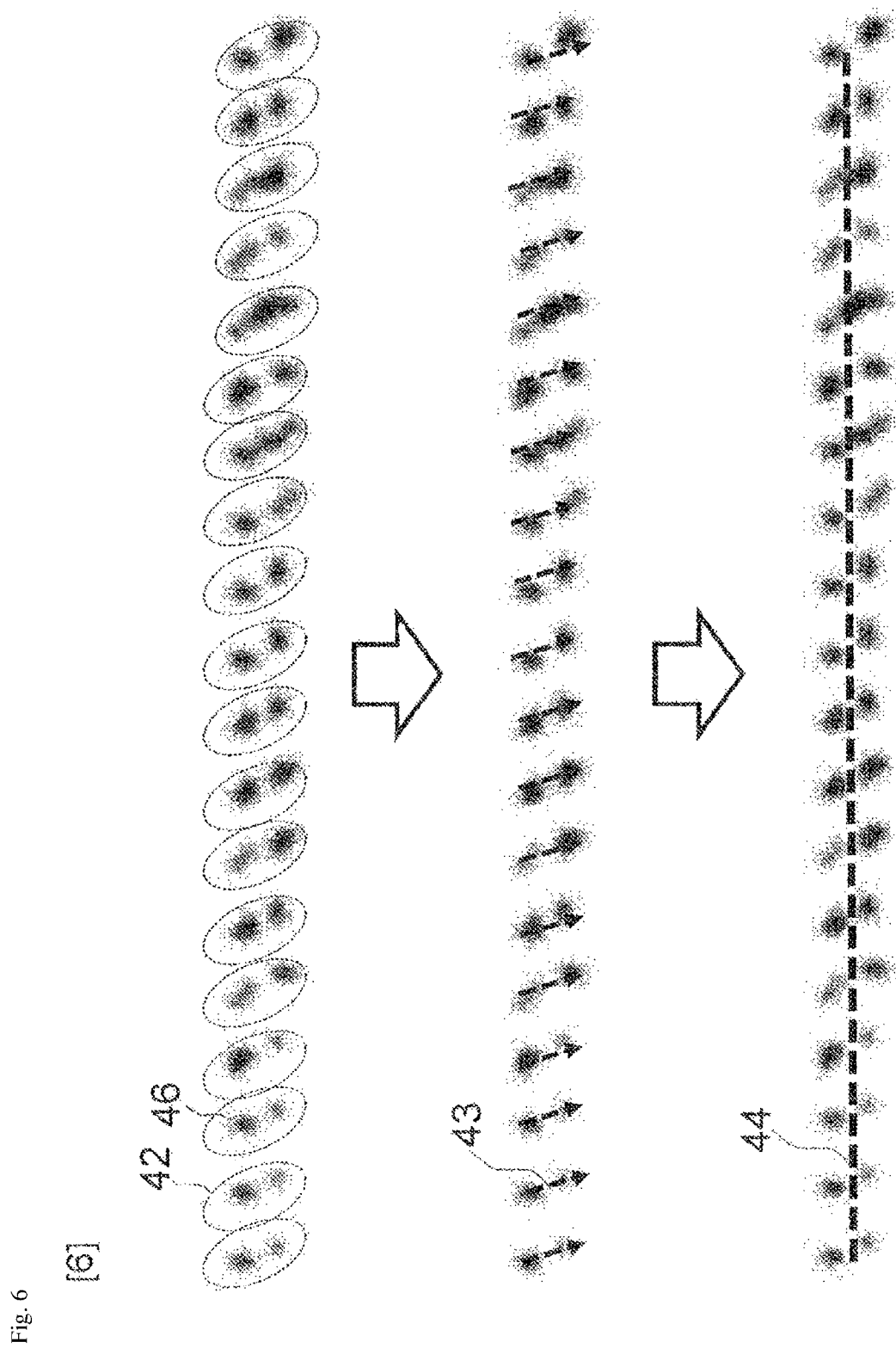
FIG. 6 is a diagram for explaining three-dimensional model generation processing from a point cloud in the three-dimensional model generation processing for a line-like structure on a rule basis.

On the other hand, FIG. 4 is a flowchart illustrating an example of a processing procedure performed by the rule-based three-dimensional model generation unit 15. Also, FIGS. 5 and 6 are diagrams for explaining details of the processing. The rule-based three-dimensional model generation unit 15 reads point cloud data to be analyzed which has been passed by the point cloud data input unit 12 (S31) and extracts point clouds within a range designated in advance (S32). Then, the rule-based three-dimensional model generation unit 15 groups the point clouds located in a three-dimensional space within the designated range (S33) and calculates a direction vector from the grouped point clouds through principal component analysis or the like (S34). The rule-based three-dimensional model generation unit 15 detects direction vectors of the line-like structure known in advance from the direction vectors (S35) and generates a three-dimensional model by coupling the detected direction vectors (S36).

For example, the range designated in Step S32 is a three-dimensional space 41 located between two three-dimensional models 82 of columnar structures and having a height known in advance as a communication line installation position. In this case, the rule-based three-dimensional model generation unit 15 extracts point clouds in the three-dimensional space 41 (S32).

FIG. 6 illustrates an example of the point clouds extracted in Step S32. Points 46 are configuration points of the point clouds included in a region 45 in the three-dimensional space 41. The rule-based three-dimensional model generation unit 15 performs grouping within the range of the oval 42 (S33) and calculates a direction vector 43 for each group (S34). At this time, the rule-based three-dimensional model generation unit 15 obtains a direction vector in a three-dimensional space as a line segment in a direction in which the configuration points 46 in the point clouds that is present in the ovals 42. The rule-based three-dimensional model generation unit 15 may detect, from a direction vector obtained in advance from a diameter of a line-like structure of an electric wire or the like to be analyzed, the same direction vectors 43 as the direction vector. A three-dimensional model 44 of the line-like structure is generated by coupling center coordinates of the detected direction vectors 43.

Three-Dimensional Model Merging Unit 16

Figure 7:
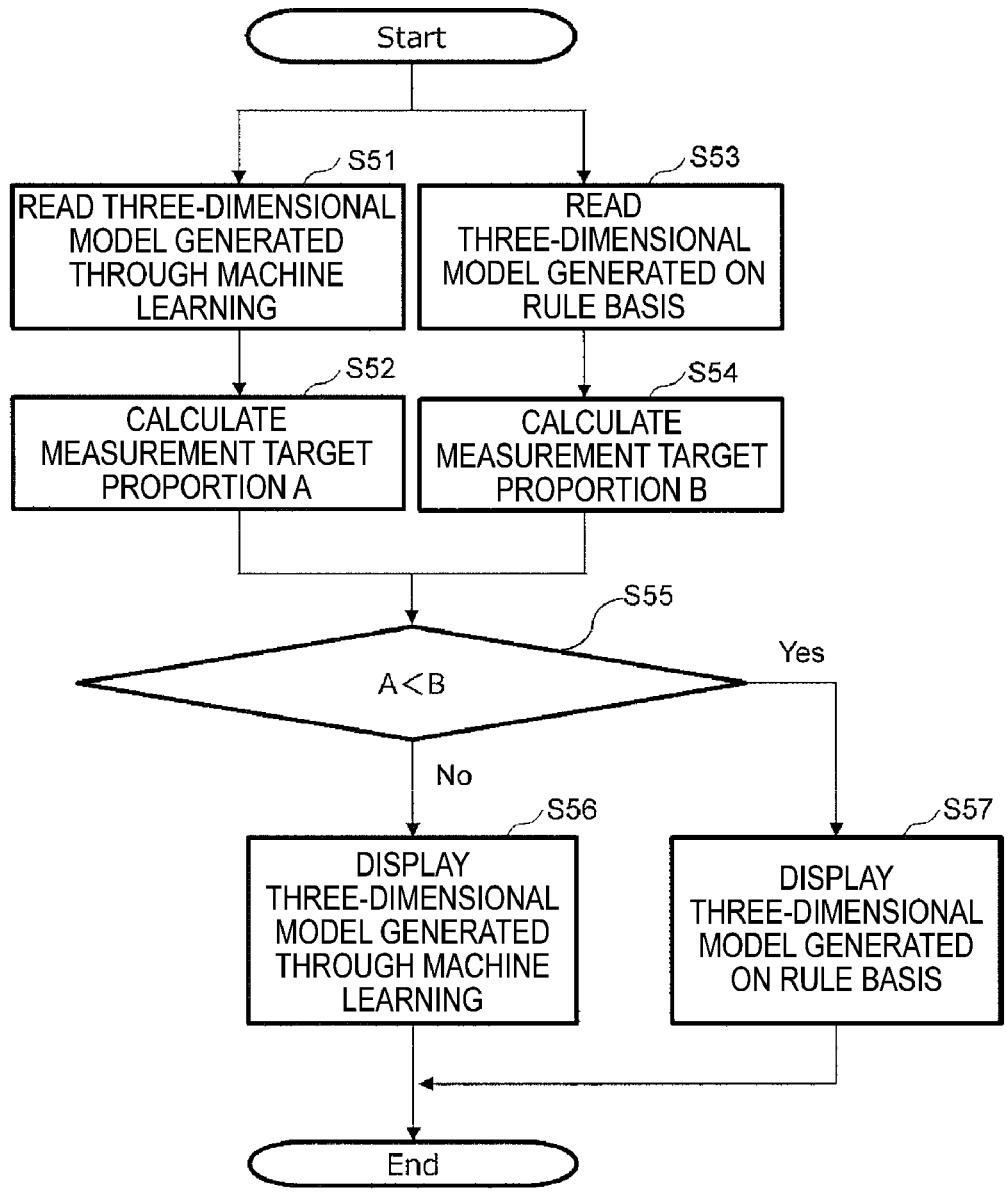
FIG. 7 is a flowchart illustrating an example of three-dimensional model merging processing.

FIG. 7 is a flowchart illustrating an example of a procedure for processing of merging a three-dimensional model generated through machine learning and a three-dimensional model generated on a rule basis. The three-dimensional model merging unit 16 reads the three-dimensional model generated through machine learning (S51) and calculates a proportion of point clouds included in the three-dimensional model as a measurement target proportion A (S52).

Figure 8:
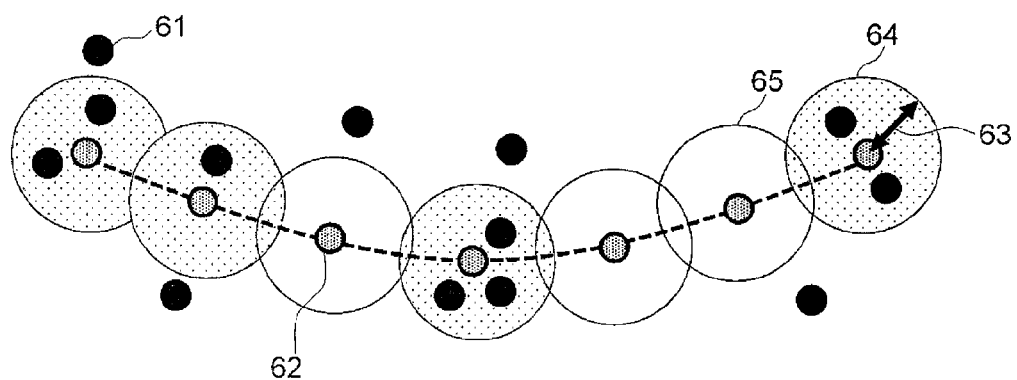
FIG. 8 is a diagram for explaining a method for calculating a measurement target proportion.

FIG. 8 is a diagram for explaining a method for calculating a measurement target proportion. A three-dimensional model of a line-like structure is configured with three-dimensional model configuration points 62 successively located at equal intervals in a three-dimensional space. The three-dimensional model merging unit 16 calculates the number of ranges 64 including configuration points 61 of a point cloud within a range of a predetermined radius 63 centered on each of the three-dimensional model configuration points 62 and the number of ranges 65 that do not include the configuration points 61 of the point cloud within the range and calculates, as a measurement target proportion, a proportion of the number of the three-dimensional model configuration points in the ranges 64 including the configuration points 61 of the point cloud to the total number of the three-dimensional model configuration points configuring a three-dimensional model of one line-like structure. In the case of FIG. 8, for example, the total number of three-dimensional model configuration points 62 is 7, the number of ranges 64 is 4, and the number of ranges 65 is 3, and the measurement target proportion is thus 4/7.

The three-dimensional model merging unit 16 reads a three-dimensional model generated on a rule basis (S53) and calculates a proportion of the point clouds included in the three-dimensional model as a measurement target proportion B similarly to Step S52 (S54). The values of the measurement target proportions A and B calculated at the same position in the three-dimensional space are compared (S55), and in a case in which A<B, the three-dimensional model generated on a rule basis is employed (S57), and the three-dimensional model generated through machine learning is removed. In a case in which A<B is not satisfied (in a case in which A≥B), the three-dimensional model generated through machine learning is employed (S56), and the three-dimensional model generated on a rule basis is removed. Certainty of the three-dimensional model of each line-like structure is thus improved by employing a three-dimensional model including more point clouds.

Also, a value obtained by multiplying the proportion of the point clouds included in the three-dimensional model by the length of the three-dimensional model may be used as the measurement target proportion. A cable model with a shorter model length is likely to have a higher measurement target proportion, and a cable model with a longer model length is likely to have a lower measurement target proportion. Moreover, it is necessary to generate a cable model of a specific amount or more in order to quantitatively recognize a structure, and in a case in which it is desired to recognize the height of a cable from the ground, for example, it is not possible to obtain the lowest point of the cable model unless half of the cable length or more is modeled, so not only the measurement target proportion but also the model length is important parameters. It is thus possible to generate a model that is close to an actual cable by comparing values l×r obtained by multiplying model lengths l of the models generated through machine learning and on a rule basis by the measurement target proportion r and employing the larger value of the two, in the processing of the three-dimensional model merging unit 16.

Line-like Structure and Columnar Structure Three-Dimensional Model Coupling Unit 18

Figure 9:
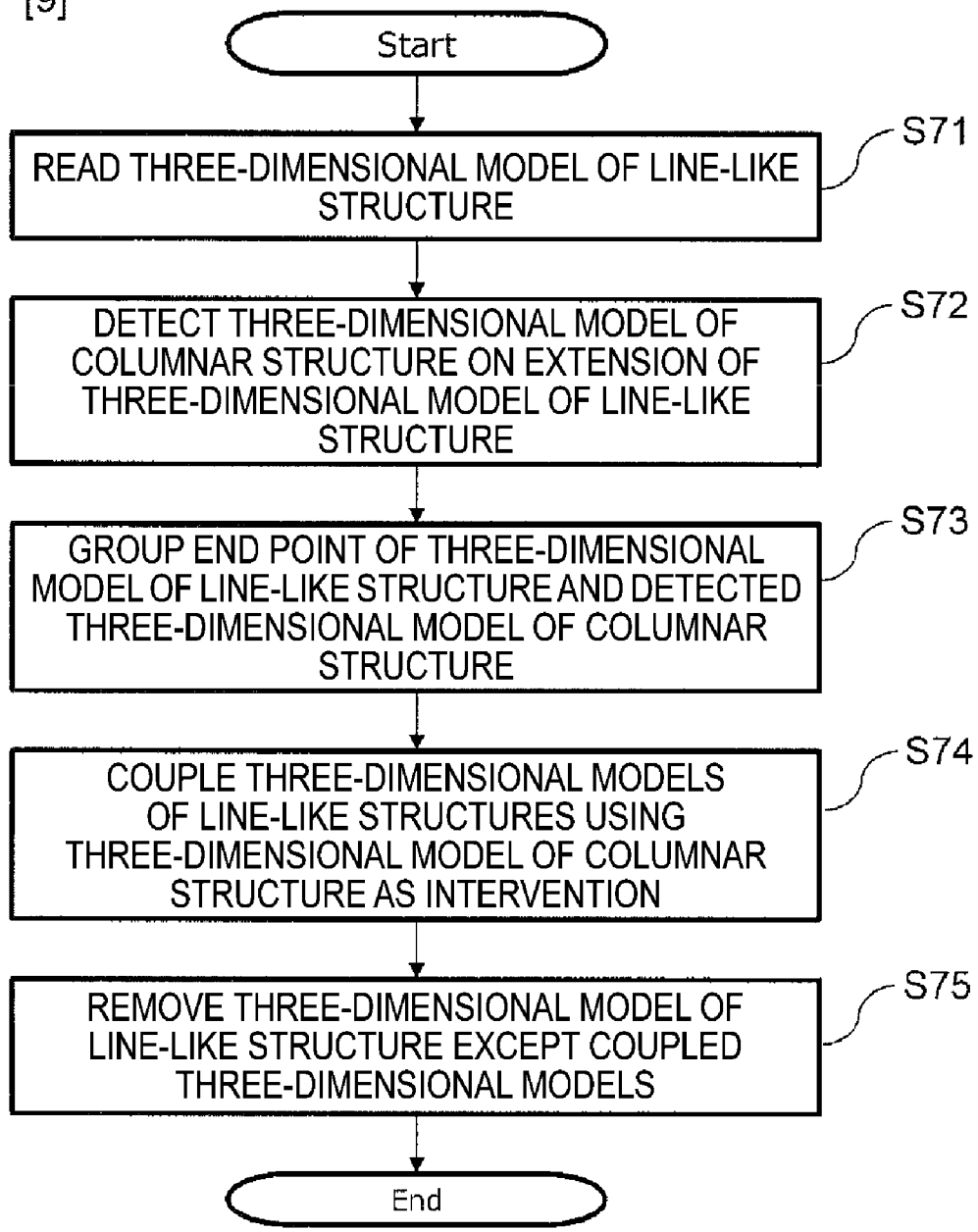
FIG. 9 is a flowchart illustrating an example of three-dimensional mesh model detection processing.
Figure 10:
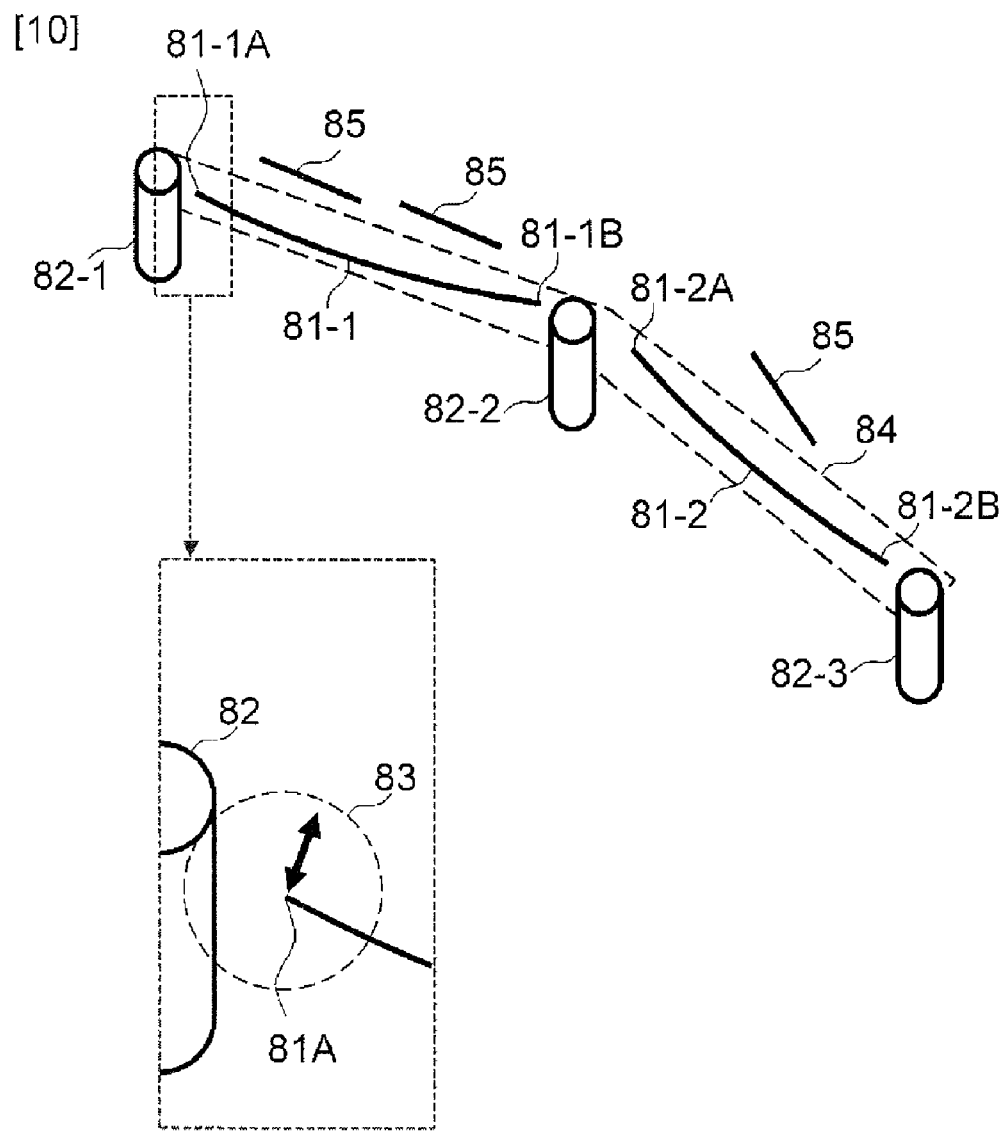
FIG. 10 is a diagram for explaining the three-dimensional mesh model detection processing.

A method for detecting a three-dimensional mesh model from an automatically generated three-dimensional model of a line-like structure will be described. FIG. 9 is a flowchart illustrating an example of a procedure for three-dimensional mesh model detection processing. Also, FIG. 10 is a diagram for explaining details of the processing.

The line-like structure and columnar structure three-dimensional model coupling unit 18 reads three-dimensional models 81-1, 81-2, and 85 of line-like structures into three-dimensional models 82-1, 82-2 and 82-3 of columnar structures that are known in advance on the basis of the related art (S71) and detects a three-dimensional model of a columnar structure within a predefined range 83 centered on an end point of each of the line-like structures (S72). For example, the line-like structure and columnar structure three-dimensional model coupling unit 18 detects the three-dimensional model 82-1 of the columnar structure disposed in the range 83 centered on an end point 81-1A of the three-dimensional model 81-1 of the line-like structure.

Next, the line-like structure and columnar structure three-dimensional model coupling unit 18 groups the detected three-dimensional model 82-1 of the columnar structure and the three-dimensional model 81-1 of the line-like structure (S73). In regard to the other end point 81-1B, the three-dimensional model 82-2 of the columnar structure is detected, and the three-dimensional model 82-2 of the columnar structure and the three-dimensional model 81-1 of the line-like structure are grouped in a similar manner. The same processing is carried out on all the three-dimensional models of the line-like structures.

A plurality of grouped three-dimensional models of the line-like structures and the columnar structures are generated, and the three-dimensional models of the line-like structures included in a group having the same three-dimensional models of the columnar structures are coupled (S74). For example, the end points 81-1B and the 81-2A are included in a group having the same three-dimensional model 82-2 of the columnar structure. Thus, the three-dimensional models 81-1 and 81-2 of the line-like structures are coupled. It is possible to detect the three-dimensional mesh model 84 from the three-dimensional models of the line-like structures through repetition of such coupling.

Here, there is a high probability that three-dimensional models 85 of the line-like structures that are not coupled are not three-dimensional models of electric wires. Thus, the line-like structure and columnar structure three-dimensional model coupling unit 18 removes the three-dimensional models 85 of the line-like structures that are not coupled in order to exclude the three-dimensional models 85 from analysis targets (S75). It is thus possible to enhance certainty of three-dimensional models of electric wires.

Three-Dimensional Model Interpolation Unit 19

Figure 11:
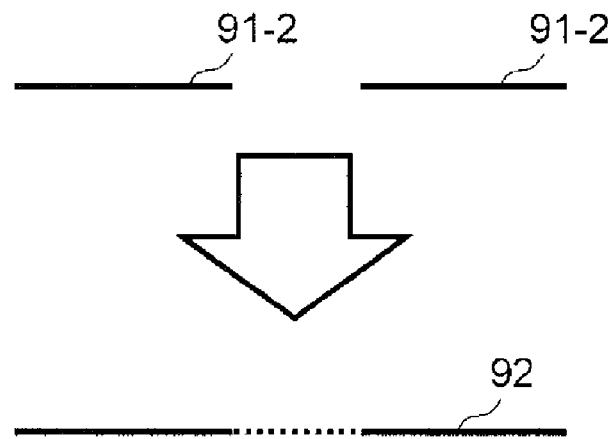
FIG. 11 is a diagram for explaining a first example of model interpolation processing in a point cloud lacking section.

FIG. 11 is a diagram for explaining model interpolation processing of a point cloud lacking section. In a case in which it is not possible to acquire a point cloud of a part of a line-like structure due to an obstacle such as a tree and the part thereof cannot be modeled, a point cloud lacking section occurs between three-dimensional models 91-1 and 92-2 of line-like structures. The three-dimensional model interpolation unit 19 interpolates the three-dimensional model of the point cloud lacking section with an approximate curve such as a quadratic curve and a catenary, on the basis of the three-dimensional models 91-1 and 92-2 outside both sections. It is thus possible to configure the three-dimensional model 92 of the line-like structure in which the three-dimensional models 91-1 and 92-2 of the line-like structures are coupled.

Figure 12:
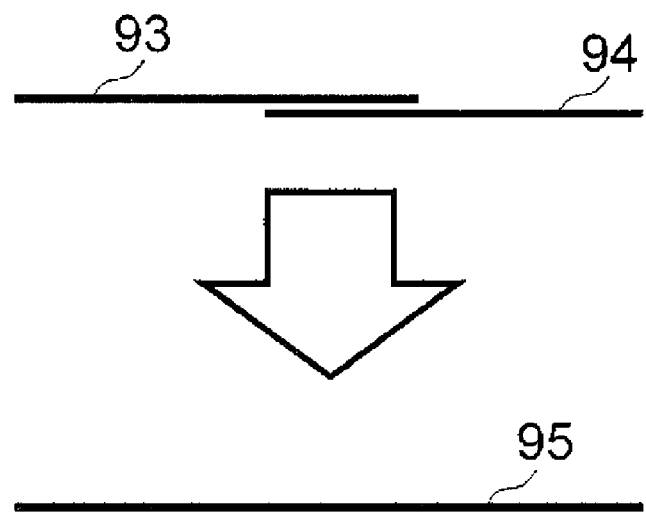
FIG. 12 is a diagram for explaining a second example of model interpolation processing in a point cloud lacking section.

Also, the same position coordinates in the three-dimensional space may be measured a plurality of times from different points of view, and point cloud data from which an obstacle has been removed depending on a change in environmental conditions may be stored in the point cloud database 11 when the point cloud data is acquired. In this case, if a point cloud lacking section occurs between the three-dimensional models 91-1 and 92-2 of the line-like structures from point cloud data in the first measurement alone, the line-like structure three-dimensional model automatic generation unit 13 generates a three-dimensional model of a line-like structure using point cloud data in the second measurement. In this manner, the line-like structure three-dimensional model automatic generation unit 13 generates three-dimensional models 93 and 94 of line-like structures illustrated in FIG. 12.

The three-dimensional model interpolation unit 19 acquires the three-dimensional model 94 of the line-like structure in the second measurement, which has not been able to be generated with the three-dimensional model 93 of the line-like structure, and joins the three-dimensional models 93 and 94 based on the position coordinates in the three-dimensional space. It is thus possible to generate a three-dimensional model 95 of a line-like structure with the point cloud lacking section interpolated.

Note that the point cloud data input unit 12 reads the point cloud data of the first measurement and the second measurement at any timings. For example, the point cloud data input unit 12 may read the point cloud data of the first measurement and the second measurement at the same timing, and the three-dimensional model merging unit 16 may generate the three-dimensional models 93 and 94 of the line-like structures at the same timing. In this case, the three-dimensional model merging unit 16 may merge the three-dimensional models 93 and 94 of the line-like structures into one three-dimensional model of a line-like structure.

In the present embodiment, a three-dimensional model of a columnar structure and a three-dimensional model of an adjacent columnar structure are connected with a three-dimensional model of a line-like structure, the three-dimensional model of the adjacent columnar structure and a three-dimensional model of a columnar structure adjacent thereto are connected with a three-dimensional model of a line-like structure, thereby obtaining a three-dimensional model as a result of the repetition thereof. Focusing on the space between a three-dimensional model of any columnar structure and a three-dimensional model of an adjacent columnar structure, information regarding a vertical height between position coordinates at which the height of the three-dimensional model of the line-like structure that is present therebetween in the three-dimensional space is the lowest (a lowest point) and a road surface is obtained to be a ground height. Also, an interval in the vertical direction between the lowest point and a line segment connecting both ends of the three-dimensional model of the line-like structure with a straight line is obtained to be a sag indicating looseness of the line-like structure.

Hardware Configuration

Figure 13:
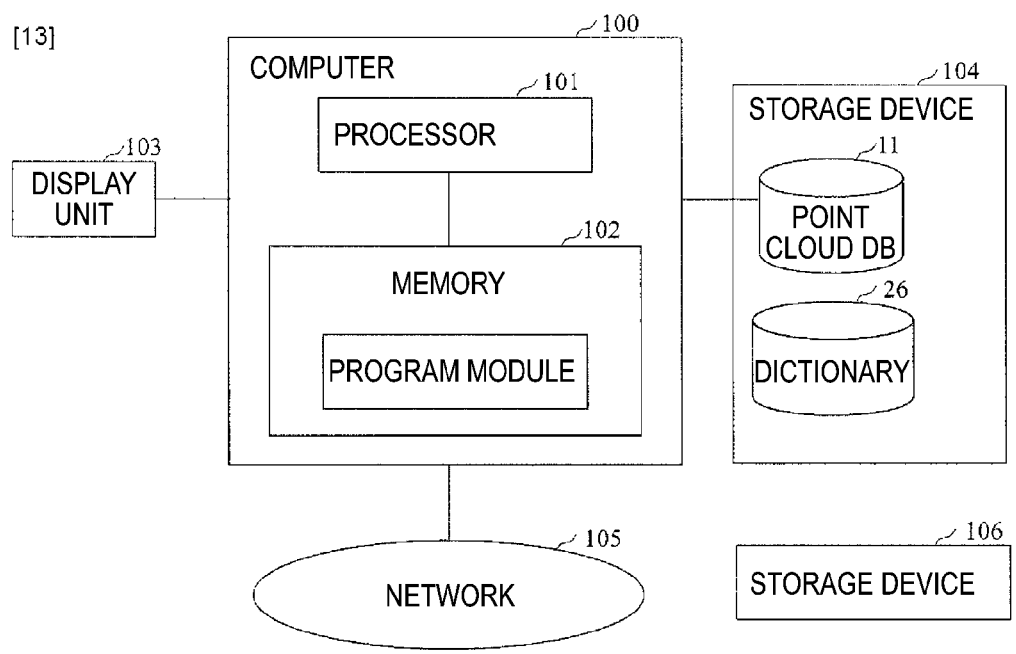
FIG. 13 illustrates an example of a hardware configuration of a system according to the disclosure.

FIG. 13 illustrates an example of a hardware configuration of the system according to the disclosure. The system according to the disclosure includes a computer 100 that functions as the detection apparatus according to the disclosure. The computer 100 may be connected to a network 105. The network 105 is a data communication network. Communication is performed using electronic signals and optical signals via the network 105.

The computer 100 includes a processor 101 and a memory 102 connected to the processor 101. The processor 101 is an electronic device configured with a logic circuit that responds to commands and executes the commands. The memory 102 is a storage medium that can be read by a tangible computer 100 with a computer program encoded. In this regard, the memory 102 stores data and commands, that is, program codes that can be read and executed by the processor 101 in order to control operations of the processor 101. One component of the memory 102 is a program module.

The program module causes the processor 101 to execute processing of any functional units included in the detection apparatus according to the disclosure. For example, the program module causes the processor 101 to execute processing of the point cloud data input unit 12, the line-like structure three-dimensional model automatic generation unit 13, the three-dimensional mesh model detection unit 17, and the result output unit 110.

The program module includes commands to control the processor 101 in order to execute the process described in the specification. Although the program module is illustrated as having already been loaded into the memory 102, the program module may be configured to be located in a storage device 106 such that the program module is loaded in the memory 102 later. The storage device 106 is a tangible computer-readable storage medium that stores the program module. Alternatively, the storage device 106 may be another type of electronic storage device that is connected to the computer 100 via the network 105.

As described above, the apparatus according to the invention can also be implemented by the computer and the program, and it is also possible to record the program in a recording medium and to provide the program through a network.

Effects of the Disclosure

The line-like structure detection apparatus, the detection method, and the detection processing program according to the disclosure are considered to be superior to the related art as follows.

First, in the related art, a three-dimensional model of a columnar structure such as a utility pole is generated, and a diameter of a circular model configuring the three-dimensional model is large. On the other hand, according to the disclosure, a three-dimensional model with a smaller diameter than that of the columnar structure is generated, and it is thus possible to generate a three-dimensional model of a line-like structure.

Second, according to the disclosure, it is possible to generate not only a three-dimensional model generated in a longitudinal shape (on the Z axis) as in the related art but also a three-dimensional model in a transverse or oblique shape (on the XYZ axes of the three-dimensional space). It is possible to know a sag and height information from a road surface of a line-like structure from the three-dimensional model and thereby to quantitatively calculate the state of the structure.

INDUSTRIAL APPLICABILITY

The present disclosure can be applied in the information communication industry.

REFERENCE SIGNS LIST

11 Point cloud database (DB)
12 Point cloud data input unit

13 Line-like structure three-dimensional model generation unit
14 Machine learning-based three-dimensional model generation unit
15 Rule-based three-dimensional model generation unit
16 Three-dimensional model merging unit
17 Three-dimensional mesh model detection unit
18 Line-like structure and columnar structure three-dimensional model coupling unit
19 Three-dimensional model interpolation unit
110 Result output unit

The invention claimed is:

1. A line-like structure detection apparatus comprising:
a processor; and
a storage medium having computer program instructions stored thereon, when executed by the processor, perform to:
read point cloud data where a structure that is present in a three-dimensional space is represented by a point cloud that is present in the three-dimensional space;
acquire point clouds read by the point cloud data input unit, combine linearly disposed point clouds out of the point clouds acquired into a group, and generate a three-dimensional model of a line-like structure using a direction vector configured with point clouds included in the group;
acquire the point clouds read by the point cloud data input unit, identify, based on a database that links point clouds and line-like structures, point clouds that match a line-like structure out of the point clouds acquired, and generate a three-dimensional model of a line-like structure using the point clouds identified; and
select, in a case where a plurality of three-dimensional models of line-like structures are generated at an identical position in the three-dimensional space from the point clouds, using position information regarding configuration points of a three-dimensional model and configuration points of the point cloud, one of the plurality of three-dimensional models of line-like structures as a three-dimensional model of a line-like structure that is present in the three-dimensional space and merge three-dimensional models of line-like structures that are present in the three-dimensional space; and
interpolate, in a case where a point cloud lacking section is present in a three-dimensional model of a line-like structure, the point cloud lacking section.

2. The line-like structure detection apparatus according to claim 1, wherein the computer program instructions further perform to, in a case where a three-dimensional model of a columnar structure that matches the point clouds read by the point cloud data input unit is present within a predetermined range from an end point of a three-dimensional model of a line-like structure merged by the three-dimensional model merging unit, coupling of the end point of the three-dimensional model of the line-like structure and the three-dimensional model of the columnar structure,
wherein a three-dimensional model of a line-like structure coupled in a mesh shape is detected through repetition of the coupling.

3. The line-like structure detection apparatus according to claim 1,
wherein three-dimensional models of line-like structures include three-dimensional model configuration points disposed at equal intervals in the three-dimensional space,
wherein the computer program instructions further perform to calculate, for each of the three-dimensional models of the line-like structures, a proportion of the number of three-dimensional model configuration points including configuration points of a point cloud within a predetermined range centered on the three-dimensional model configuration points to the number of the three-dimensional model configuration points and selects a three-dimensional model of a line-like structure with a higher proportion as the three-dimensional model of the line-like structure that is present in the three-dimensional space.

4. A non-transitory computer-readable medium having computer-executable instructions that, upon execution of the instructions by a processor of a computer, cause the computer to function as the line-like structure detection apparatus according to claim 1.

5. A line-like structure detection method comprising:
by a line-like structure detection apparatus, reading point cloud data where a structure that is present in a three-dimensional space is represented by a point cloud that is present in the three-dimensional space;
by the line-like structure detection apparatus, acquiring point clouds that are read, combining linearly disposed point clouds out of the point clouds acquired into a group, and generating a three-dimensional model of a line-like structure using a direction vector configured with point clouds included in the group;
by the line-like structure detection apparatus, acquiring point clouds that are read, identifying, based on a database that links point clouds and line-like structures, point clouds that match a line-like structure out of the point clouds acquired, and generating a three-dimensional model of a line-like structure using the point clouds identified;
by the line-like structure detection apparatus, selecting, in a case where a plurality of three-dimensional models of line-like structures are generated at an identical position in the three-dimensional space from the point clouds that are read, using position information regarding configuration points of a three-dimensional model and configuration points of the point cloud, one of the plurality of three-dimensional models of line-like structures as a three-dimensional model of a line-like structure that is present in the three-dimensional space and merging three-dimensional models of line-like structures that are present in the three-dimensional space; and
by the line-like structure detection apparatus, interpolating, in a case where a point cloud lacking section is present in a three-dimensional model of a line-like structure, the point cloud lacking section.

6. The line-like structure detection method of claim 5 further comprises, in a case where a three-dimensional model of a columnar structure that matches the point clouds read by the point cloud data input unit is present within a predetermined range from an end point of a three-dimensional model of a line-like structure merged by the three-dimensional model merging unit, coupling of the end point of the three-dimensional model of the line-like structure and the three-dimensional model of the columnar structure,
wherein a three-dimensional model of a line-like structure coupled in a mesh shape is detected through repetition of the coupling.

7. The line-like structure detection method of claim 5 wherein three-dimensional models of line-like structures include three-dimensional model configuration points disposed at equal intervals in the three-dimensional space, and further comprises calculating, for each of the three-dimensional models of the line-like structures, a proportion of the number of three-dimensional model configuration points including configuration points of a point cloud within a predetermined range centered on the three-dimensional model configuration points to the number of the three-dimensional model configuration points and selecting a three-dimensional model of a line-like structure with a higher proportion as the three-dimensional model of the line-like structure that is present in the three-dimensional space.

* * * * *